United States Patent
Claassen et al.

(10) Patent No.: US 8,009,430 B2
(45) Date of Patent: Aug. 30, 2011

(54) TECHNIQUES FOR DATA CENTER COOLING

(75) Inventors: Alan Claassen, Fremont, CA (US); Hendrik F. Hamann, Yorktown Heights, NY (US); Madhusudan K. Iyengar, Woodstock, NY (US); James Andrew Lacey, Mahopac, NY (US); Yves C. Martin, Ossining, NY (US); Roger R. Schmidt, Poughkeepsie, NY (US); Theodore Gerard van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 11/750,322

(22) Filed: May 17, 2007

(65) Prior Publication Data

US 2008/0285232 A1 Nov. 20, 2008

(51) Int. Cl.
*H05K 7/20* (2006.01)
*H05K 5/00* (2006.01)
*A47B 81/00* (2006.01)
(52) U.S. Cl. ........ 361/724; 361/690; 361/694; 361/752; 454/184; 312/223.2
(58) Field of Classification Search .......... 361/694, 361/690, 724, 752; 454/184; 312/223.2
See application file for complete search history.

(56) References Cited

U.S. PATENT DOCUMENTS

| | | | | |
|---|---|---|---|---|
| 3,120,166 | A * | 2/1964 | Lyman | 454/307 |
| 4,644,443 | A | 2/1987 | Swensen et al. | |
| 4,856,420 | A * | 8/1989 | Poblete et al. | 454/59 |
| 5,136,464 | A * | 8/1992 | Ohmori | 361/694 |
| 5,150,277 | A * | 9/1992 | Bainbridge et al. | 361/695 |
| 5,467,250 | A * | 11/1995 | Howard et al. | 361/696 |
| 5,717,572 | A * | 2/1998 | Smith et al. | 361/695 |
| 5,718,628 | A * | 2/1998 | Nakazato et al. | 454/184 |
| 6,088,219 | A * | 7/2000 | Yanniello et al. | 361/657 |
| 6,088,225 | A | 7/2000 | Parry et al. | |
| 6,157,534 | A * | 12/2000 | Gallagher et al. | 361/724 |

(Continued)

FOREIGN PATENT DOCUMENTS

JP  2003-204183  7/2003

OTHER PUBLICATIONS

Advertisement—Magnetic Air Deflector.

(Continued)

*Primary Examiner* — Jayprakash N Gandhi
*Assistant Examiner* — Bradley H Thomas
(74) *Attorney, Agent, or Firm* — Vazken Alexanian; Michael J. Chang, LLC

(57) ABSTRACT

Techniques for cooling in a data center are provided. In one aspect a computer equipment rack is provided comprising one or more air inlets; one or more exhaust outlets, and one or more of: an air inlet duct mounted to the computer equipment rack surrounding at least a portion of the air inlets, the air inlet duct having a lateral dimension that approximates a lateral dimension of the computer equipment rack and a length that is less than a length of the computer equipment rack, and an air exhaust duct mounted to the computer equipment rack surrounding at least a portion of the exhaust outlets, the air exhaust duct having a lateral dimension that approximates the lateral dimension of the computer equipment rack and a length that is less than the length of the computer equipment rack.

18 Claims, 8 Drawing Sheets

U.S. PATENT DOCUMENTS

| | | | | |
|---|---|---|---|---|
| 6,164,369 | A * | 12/2000 | Stoller | 165/104.33 |
| 6,374,627 | B1 * | 4/2002 | Schumacher et al. | 62/259.2 |
| 6,554,697 | B1 * | 4/2003 | Koplin | 454/184 |
| 6,589,308 | B1 * | 7/2003 | Gianelo | 55/385.6 |
| 6,611,428 | B1 * | 8/2003 | Wong | 361/695 |
| 6,747,872 | B1 * | 6/2004 | Patel et al. | 361/695 |
| 6,832,489 | B2 * | 12/2004 | Bash et al. | 62/180 |
| 6,867,967 | B2 * | 3/2005 | Mok | 361/679.49 |
| 6,877,551 | B2 * | 4/2005 | Stoller | 165/47 |
| 6,889,752 | B2 * | 5/2005 | Stoller | 165/47 |
| 6,896,612 | B1 * | 5/2005 | Novotny | 454/184 |
| 6,973,410 | B2 | 12/2005 | Seigel | |
| 6,987,673 | B1 * | 1/2006 | French et al. | 361/727 |
| 7,031,154 | B2 * | 4/2006 | Bash et al. | 361/690 |
| 7,182,208 | B2 * | 2/2007 | Tachibana | 211/26 |
| 7,197,433 | B2 | 3/2007 | Patel et al. | |
| 7,266,964 | B2 * | 9/2007 | Vogel et al. | 62/259.2 |
| 7,283,358 | B2 * | 10/2007 | Campbell et al. | 361/694 |
| 7,313,924 | B2 * | 1/2008 | Bash et al. | 62/178 |
| 7,379,298 | B2 * | 5/2008 | Walsh et al. | 361/692 |
| 7,403,391 | B2 * | 7/2008 | Germagian et al. | 361/695 |
| 2002/0149911 | A1 * | 10/2002 | Bishop et al. | 361/690 |
| 2003/0050003 | A1 * | 3/2003 | Charron | 454/184 |
| 2004/0023614 | A1 * | 2/2004 | Koplin | 454/184 |
| 2004/0190247 | A1 | 9/2004 | Chu et al. | |
| 2004/0218355 | A1 * | 11/2004 | Bash et al. | 361/690 |
| 2004/0257766 | A1 * | 12/2004 | Rasmussen et al. | 361/689 |
| 2005/0016195 | A1 * | 1/2005 | Bretschneider et al. | 62/263 |
| 2005/0068723 | A1 * | 3/2005 | Squillante | 361/687 |
| 2005/0152112 | A1 * | 7/2005 | Holmes et al. | 361/695 |
| 2005/0170770 | A1 * | 8/2005 | Johnson et al. | 454/184 |
| 2005/0225936 | A1 * | 10/2005 | Day | 361/687 |
| 2005/0228618 | A1 | 10/2005 | Patel et al. | |
| 2005/0237714 | A1 * | 10/2005 | Ebermann | 361/695 |
| 2005/0237716 | A1 * | 10/2005 | Chu et al. | 361/696 |
| 2005/0248043 | A1 * | 11/2005 | Bettridge et al. | 261/27 |
| 2005/0278070 | A1 | 12/2005 | Bash et al. | |
| 2006/0057954 | A1 * | 3/2006 | Hrebeniuk | 454/256 |
| 2006/0139877 | A1 * | 6/2006 | Germagian et al. | 361/695 |
| 2006/0139879 | A1 * | 6/2006 | Holmes et al. | 361/695 |
| 2006/0141921 | A1 * | 6/2006 | Turek et al. | 454/184 |
| 2006/0168975 | A1 | 8/2006 | Malone et al. | |
| 2007/0019380 | A1 | 1/2007 | Campbell et al. | |
| 2007/0032979 | A1 | 2/2007 | Hamann et al. | |
| 2007/0074527 | A1 * | 4/2007 | Lee et al. | 62/344 |
| 2007/0078635 | A1 | 4/2007 | Rasmussen et al. | |
| 2007/0129000 | A1 * | 6/2007 | Rasmussen et al. | 454/184 |
| 2007/0144704 | A1 * | 6/2007 | Bundza et al. | 165/48.1 |
| 2007/0174024 | A1 | 7/2007 | Rasmussen et al. | |
| 2007/0213000 | A1 * | 9/2007 | Day | 454/184 |
| 2007/0242432 | A1 * | 10/2007 | Campbell et al. | 361/695 |
| 2008/0068791 | A1 * | 3/2008 | Ebermann | 361/690 |
| 2009/0112522 | A1 | 4/2009 | Rasmussen | |
| 2009/0201293 | A1 | 8/2009 | Tung et al. | |
| 2009/0308244 | A1 * | 12/2009 | Brichese et al. | 95/20 |

OTHER PUBLICATIONS

"Thermography Assessment" by America Power Conversion Corporation, Dec. 14, 2006.

Neil Rasmussen, Implementing Energy Efficient Data Centers, White Paper published by the American Power Conversion, Document No. 114 (2006).

Neil Rasmussen, Power and Cooling Capacity Management for Data Centers, White paper published by the American Power Conversion. Document No. 150, (2007).

Bridget Botelho, Big Blue pushes green computing project, News Writer, SearchDataCenter.com, May 14, 2007.

Brad Dupuy, Implementing Green Technology, HP Technology Solutions, presentation at Los Angeles Technology Forum, Dec. 3, 2007.

Data Center Electrical Efficiency Assessment, Schneider Electric, 2009.

Juri Paraszczak, Smarter Planet—Examples from our Research, IBM Research, presentation at CIO Leadership Exchange, 2009.

Data Center Optimization—Energy Smart Assessment, Dell Inc., 2008.

J.G. Koomey, *Estimating Total Power Consumption By Servers In The U.S. and The World*, A report by the Lawrence Berkeley National Laboratory, Feb. 2007.

*Green Grid Metrics—Describing Data Center Power Efficiency*, Technical Committee White Paper by the Green Grid Industry Consortium, Feb. 20, 2007.

W. Tschudi, *Best Practices Identified Through Benchmarking Data Centers*, presentation at the ASHRAE Summer Conference, Quebec City, Canada, Jun. 2006.

*High Performance Data Centers—A Design Guidelines Sourcebook*, Pacific Gas and Electric Company Report, Developed by Rumsey Eng. & Lawrence Berkeley National Labs (2006).

R. Schmidt, and M. Iyengar, *Best Practices for Data Center Thermal and Energy Management—Review of Literature—*, Proceedings of the ASHRAE Winter Meeting in Chicago, Paper DA-07-022 (2006).

C. Kurkjian and J. Glass, *Air-Conditioning Design for Data Centers—Accommodating Current Loads and Planning for the Future*, ASHRAE Transactions, vol. 111, Part 2, Paper No. DE-05-11-1 (2005).

Neil Rasmussen, *Electrical Efficiency Modeling of Data Centers*, White paper published by the American Power Conversion. Document No. 113, version 1 (2006).

*Maximizing Building Energy Efficiency And Comfort Continuous Commissioning Guidebook for Federal Energy Managers*, A report published by Federal Energy Management Program (FEMP)—U.S. Department of Energy (DOE), Prepared by Texas A&M University and University of Nebraska, Chapter 6, p. 2, Oct. 2002.

Kavita A. Vallabhaneni, *Benefits of Water-Cooled Systems vs. Air-Cooled Systems for Air-Conditioning Applications*, Presentation from the website of the Cooling Technology Institute.

*Improving industrial productivity through energy-efficient advancements—Energy Council for an Energy-Efficient Economy (ACEEE)*, http://www.progress-energy.com/Savers—*Chiller Optimization and Energy Efficient Chillers*.

* cited by examiner

TECHNIQUES FOR DATA CENTER COOLING

CROSS-REFERENCE TO RELATED APPLICATIONS

This application is related to the commonly owned U.S. application Ser. No. 11/750,325, entitled "Techniques for Analyzing Data Center Energy Utilization Practices," filed herewith on the same day of May 17, 2007, the contents of which are incorporated herein by reference as fully set forth herein.

FIELD OF THE INVENTION

The present invention relates to cooling of computer equipment, and more particularly, to techniques for enhancing data center cooling systems.

BACKGROUND OF THE INVENTION

Computer equipment is continually evolving to operate at higher power levels. Increasing power levels pose challenges with regard to heat management. For example, many data centers now employ individual racks of blade servers that can develop 20,000 watts, or more, worth of thermal load. Typically, the servers are air cooled and, in most cases., the data center air cooling systems are not designed to handle the thermal load.

To help address this problem, computer equipment in data centers are commonly arranged using a "hot aisle/cold aisle" configuration. According to this scheme, racks of computer equipment are arranged in a series of rows forming a series of aisles, such that the computer equipment draws cooled air from one isle (a "cold aisle") and expels heated air into another isle (a "hot aisle"). A hot aisle /cold aisle configuration increases the efficiency of a data center cooling system by reducing mixing of the heated and the cooled air.

Cooled air is usually supplied to the computer equipment by an air cooling unit, e.g., via a cold aisle. The heated air expelled from the computer equipment travels back to the air cooling unit, e.g., by way of a hot aisle. At the air cooling unit, the air is cooled, completing a full cooling cycle.

Ideally, according to the cooling cycle described above, the cooled air travels directly to an air inlet in the computer equipment where it cools the equipment, is exhausted directly to a hot aisle and then returns to the air cooling unit so as to complete a direct loop through the equipment being cooled. Inefficiencies arise, however, when cooled air is supplied and returns directly to the air cooling unit without circulating through the equipment.

Inefficiencies can also arise when heated exhaust air, rather than returning to the air cooling unit, recirculates back into the equipment. There are a number of such recirculation possibilities. Air recirculation constitutes an energy loss, in that energy is spent circulating the flow, but cooling does not result. This problem is compounded in data centers where the hot aisle/cold aisle arrangement is not employed. In such cases, heated exhaust air from the equipment on one rack can flow directly into the air inlets of equipment on an adjacent rack.

Recirculation difficulties can be most severe for equipment located at the tops of racks. Namely, cooled air can be drawn off by equipment lower in the racks leaving only heated expelled air to be drawn into the equipment located higher in the racks.

Significant cooling system optimization is now required to handle the modern generation of servers and storage systems as data centers expand their capabilities. Thus, techniques for increasing the effectiveness and efficiency of data center cooling systems would be desirable.

SUMMARY OF THE INVENTION

The present invention provides techniques for cooling in a data center. In one aspect of the invention, a computer equipment rack is provided. The computer equipment rack comprises one or more air inlets; one or more exhaust outlets: and one or more of: an air inlet duct mounted to the computer equipment rack surrounding at least a portion of the air inlets, the air inlet duct having a lateral dimension that approximates a lateral dimension of the computer equipment rack and a length that is less than a length of the computer equipment rack, wherein the air inlet duct is configured to redirect an incoming air flow at the air inlets, and an air exhaust duct mounted to the computer equipment rack surrounding at least a portion of the exhaust outlets, the air exhaust duct having a lateral dimension that approximates the lateral dimension of the computer equipment rack and a length that is less than the length of the computer equipment rack, wherein the air exhaust duct is configured to redirect outgoing air flow at the exhaust outlets.

In another aspect of the invention, a data center is provided. The data center comprises computer equipment racks arranged in a series of rows, defining a series of aisles; and one or more computer air conditioning units configured to cycle air through the data center. Each of the computer equipment racks comprises air inlets, exhaust outlets, and one or more of: an air inlet duct mounted to the computer equipment rack surrounding at least a portion of the air inlets, the air inlet duct having a lateral dimension that approximates a lateral dimension of the computer equipment rack and a length that is less than a length of the computer equipment rack, wherein the air inlet duct is configured to redirect an incoming air flow at the air inlets, and an air exhaust duct mounted to the computer equipment rack surrounding at least a portion of the exhaust outlets, the air exhaust duct having a lateral dimension that approximates the lateral dimension of the computer equipment rack and a length that is less than the length of the computer equipment rack, wherein the air exhaust duct is configured to redirect outgoing air flow at the exhaust outlets.

In yet another aspect of the invention, a method of cooling in a data center having computer equipment racks arranged in a series of rows, defining a series of aisles, each computer equipment rack having air inlets and exhaust outlets, is provided. The method comprises the steps of, to each of one or more of the computer equipment racks, mounting one or more of: an air inlet duct surrounding at least a portion of the air inlets, the air inlet duct having a lateral dimension that approximates a lateral dimension of the computer equipment rack and a length that is less than a length of the computer equipment rack, and an air exhaust duct surrounding at least a portion of the exhaust outlets, the air exhaust duct having a lateral dimension that approximates the lateral dimension of the computer equipment rack and a length that is less than the length of the computer equipment rack; cycling air through the data center; and redirecting one or more of an incoming air flow at one or more of the air inlets and an outgoing air flow at one or more of the exhaust outlets.

A more complete understanding of the present invention, as well as further features and advantages of the present invention, will be obtained by reference to the following detailed description and drawings.

DETAILED DESCRIPTION OF PREFERRED EMBODIMENTS

Figure 1:
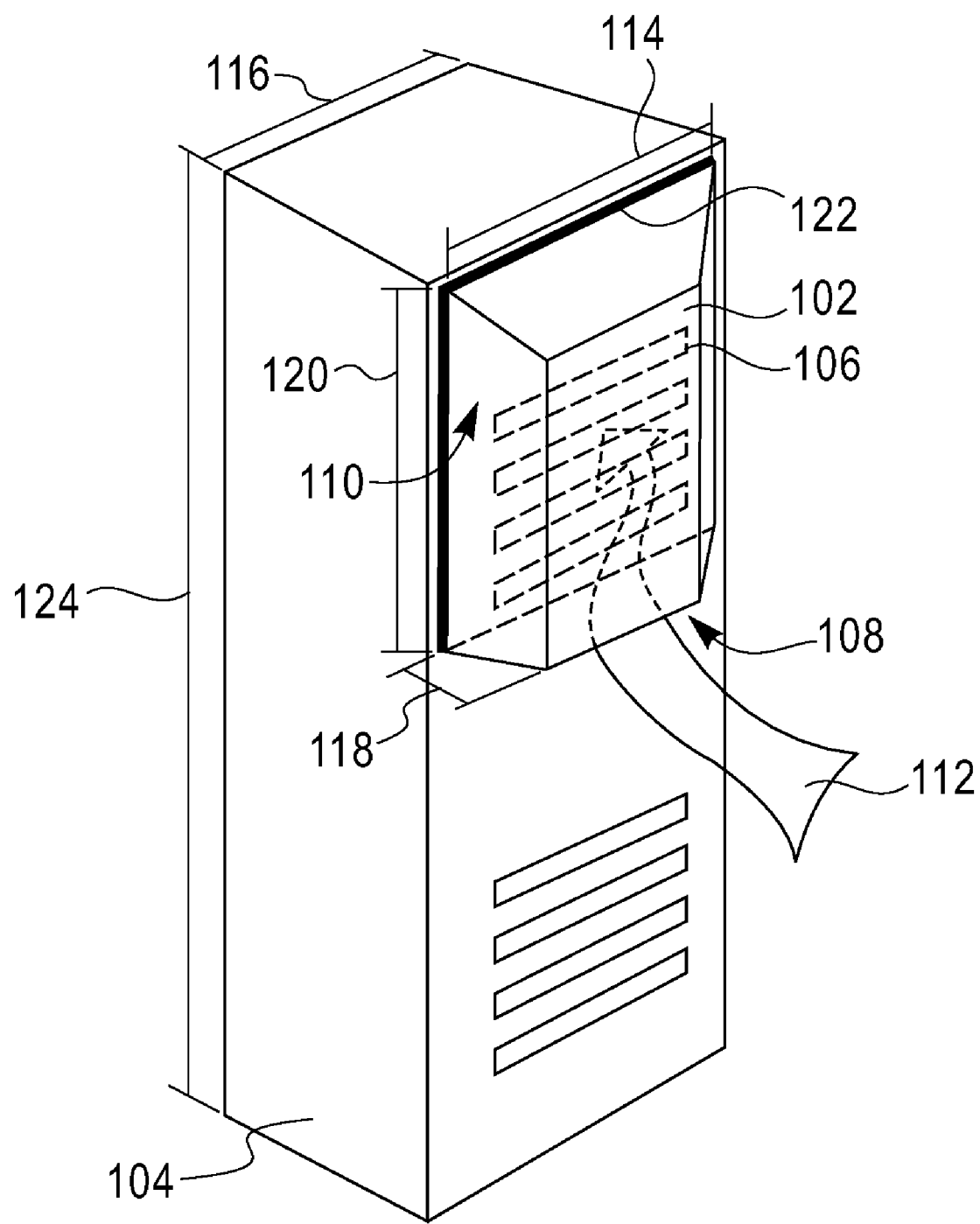
FIG. 1 is a diagram illustrating a computer equipment rack having an exemplary air inlet redirection duct mounted thereto according to an embodiment of the present invention.

FIG. 1 is a diagram illustrating exemplary computer equipment rack 104 having air inlet redirection duct 102 mounted thereto. As will be described in detail below, an air inlet redirection duct can increase the efficiency of a data center cooling system by helping to minimize air recirculation effects and to prevent cooled air from being cycled without passing through the equipment.

Computer equipment rack 104 comprises air inlet ports, perforations, vents, holes or slots (hereinafter "air inlets"), e.g., air inlets 106, through which air is drawn to cool the computer equipment therein. Air inlets typically found on computer equipment racks are well known to those of ordinary skill in the art, and are not described further herein.

Air inlet redirection duct 102, when mounted to computer equipment rack 104 so as to surround at least a portion of air inlets 106, provides a continuous air passageway through open end 108/open side 110 and into air inlets 106. e.g., as indicated by arrow 112. Air inlet redirection duct 102 is a partial duct structure in that air inlet redirection duct 102 has a length 120 that is less than a length 124 of computer equipment rack 104, such that air inlet redirection duct 102, when mounted to computer equipment rack 104, extends along only a portion of the length 124 of computer equipment rack 104. According to an exemplary embodiment, air inlet redirection duct 102 has a length 120 that is less than or equal to about 0.5 times the length 124 of computer equipment rack 104. As will be described in detail below, an air inlet redirection partial duct structure, such as air inlet redirection duct 102, allows penetration of the air inlets into cooler air layers closer to the floor without significantly impeding air flow to computer equipment at middle and upper levels behind the air inlet redirection duct on the computer equipment rack.

Air inlet redirection duct dimensions and associated area are chosen to correspond to intake requirements of the equipment and to assure that the air inlet redirection duct does not impede air flow. According to an exemplary embodiment, air inlet redirection duct 102 has a lateral dimension 114 that approximates, e.g., is up to about three inches less than, a lateral dimension 116 of computer equipment rack 104. For example, lateral dimension 114 of air inlet redirection duct 102 can equal lateral dimension 116 of computer equipment rack 104. A typical lateral dimension of a computer equipment rack, e.g., lateral dimension 116 of computer equipment rack 104, is about 24 inches. Thus, in that instance, lateral dimension 114 of air inlet redirection duct 102 can also equal about 24 inches. A depth 118 and a cross-sectional area of air inlet redirection duct 102 are chosen to allow a desired air flow to occur therethrough. By way of example only, a depth 118 of about six inches to about 12 inches and a cross-sectional area, e.g., a cross-sectional area of open end 108 (shown in FIG. 1 as being, for example, trapezoidal in shape), of from about one square foot to about two square feet can be employed.

A length 120 of air inlet redirection duct 102 is also chosen to allow a desired air flow. For example, an air inlet redirection duct can be configured to extend from a top of the computer equipment rack to a mid plane of the computer equipment rack. In most data centers, this configuration assures that the inlet of the air inlet redirection duct is placed well into cooler air layers located closer to the floor, and maximally rejects exhaust recirculation over a top of the computer equipment rack. Experiments show that the mid plane is optimal for many situations. By way of example only, based on a typical length (e.g., length 124) of a computer equipment rack of about seven feet, a length 120 of about 3.5 feet can be employed. As highlighted above, this air inlet redirection duct length significantly allows penetration of the air inlets at the top of the computer equipment rack into the cooler air layers closer to the floor.

Length 120 can be varied, i.e., shortened or lengthened. For example, a shorter air inlet redirection duct may be used if inlet flow requirements are high and the desired extension of the air inlet redirection duct in front of the computer equipment rack is constrained due to narrow aisle size. According to one embodiment, length 120 is chosen to be small, e.g., up to about three inches, such that air inlet redirection duct 102 effectively becomes a deflector plate that simply blocks recirculated air flowing over the top of the computer equipment rack.

Computer equipment racks, such as computer equipment rack 104, are almost universally made of steel and have flat doors on the fronts and backs containing the air inlets, such as air inlets 106, and air outlets (described below) that allow air flow through the doors to cool the computer equipment therein. According to an exemplary embodiment, air inlet redirection duct 102 is mounted to computer equipment rack 104 in a removable, semi-permanent manner using clips, screws, nuts, rivets, hinges, hooks or other mechanical fasteners. As such, air inlet redirection duct 102 can be easily removed from computer equipment rack 104 so as not to interfere with the opening and closing of equipment rack doors, or with any other normal data center operations, such as maintenance operations. Air redirection duct configurations that permit opening and closing of computer equipment rack doors while the air redirection duct remains mounted to the computer equipment rack are described, for example, in conjunction with the description of FIG. 2, below.

According to another exemplary embodiment, air inlet redirection duct 102 can be mounted to computer equipment rack 104 in a removable, semi-permanent manner using magnetic fasteners, such as magnetic strip 122 that is glued or mechanically joined using screws or other mechanical fasteners to air inlet redirection duct 102 along its rim, e.g., three perimeter edges that are adjacent to and abut computer equipment rack 104 (see, for example, FIG. 1 wherein two of the three perimeter edges are visible). Magnetic strip 122 will attract the steel in computer equipment rack 104, thereby producing an effective, semi-permanent attachment of air inlet redirection duct 102 to computer equipment rack 104. This allows air inlet redirection duct 102 to be easily removed so as not to interfere with the opening and closing of equipment rack doors, or with any other normal data center operations, such as maintenance operations. Variations on this embodiment include the use of individual magnetic elements, such as rings (similar in shape to washers) and bars that are attached at discrete points on the rim of air inlet redirection duct 1(02. i.e., where air inlet redirection duct 102 contacts computer equipment rack 104. In this case, the individual magnetic elements are glued, or mechanically joined using screws or other mechanical fasteners, to air inlet redirection duct 102. Further, combinations of magnetic and mechanical fasteners are possible. For example, a magnetic plate with hooks can be attached to the door of computer equipment rack 1(04 and air inlet redirection duct 102 is hung on the hooks.

Air inlet redirection duct 102 can be composed of any suitable material, including, but not limited to, one or more of a rigid sheet material, such as aluminum, steel, plastic, fiberboard, fiberglass. carbon fiber composite and Kevlar® fiber composite (manufactured by E. I. du Pont de Nemours and Company, Wilmington, Del.), and a transparent material, such as polymethyl methacrylate (PMMA), e.g., Plexiglass® (manufactured by Arkema Inc., Philadelphia, Pa.) and polycarbonate. The use of a transparent material to form air inlet redirection duct 102 advantageously permits equipment indicator lights, visible through the doors of computer equipment rack 104, to remain visible to operators even with the air inlet redirection duct 102 in place.

According to another exemplary embodiment, air inlet redirection duct 102 can have a temperature sensor associated therewith, i.e., mounted to an internal and/or external surface thereof, to monitor the air temperature within, or the surface temperature of, air inlet redirection duct 102. A suitable temperature sensor includes, but is not limited to, one or more of, a thermocouple, a bimetallic strip, a liquid crystal temperature sensing strip, a resistance temperature detector (RTD), a thermistors, an infrared sensor, a pyrometer or other suitable temperature sensor. The associated electronics and readout display for the temperature sensor can be integrated locally as a single unit, or remotely, according to the needs of the data center. In one exemplary embodiment, a liquid crystal temperature sensing strip is glued to a visible exterior location on air inlet redirection duct 102 to directly sense the duct, i.e., shell, temperature. In another exemplary embodiment, a wireless temperature sensor is placed inside air inlet redirection duct 102 such that an interior temperature of air inlet redirection duct 102 can be monitored remotely.

Air inlet redirection duct 102 can also comprise one or more internal structures, such as plates, baffles or penetrations therein (not shown) to affect., i.e., adjust or modify, air flow through the air inlet redirection duct. These internal structures are optional.

Figure 2:
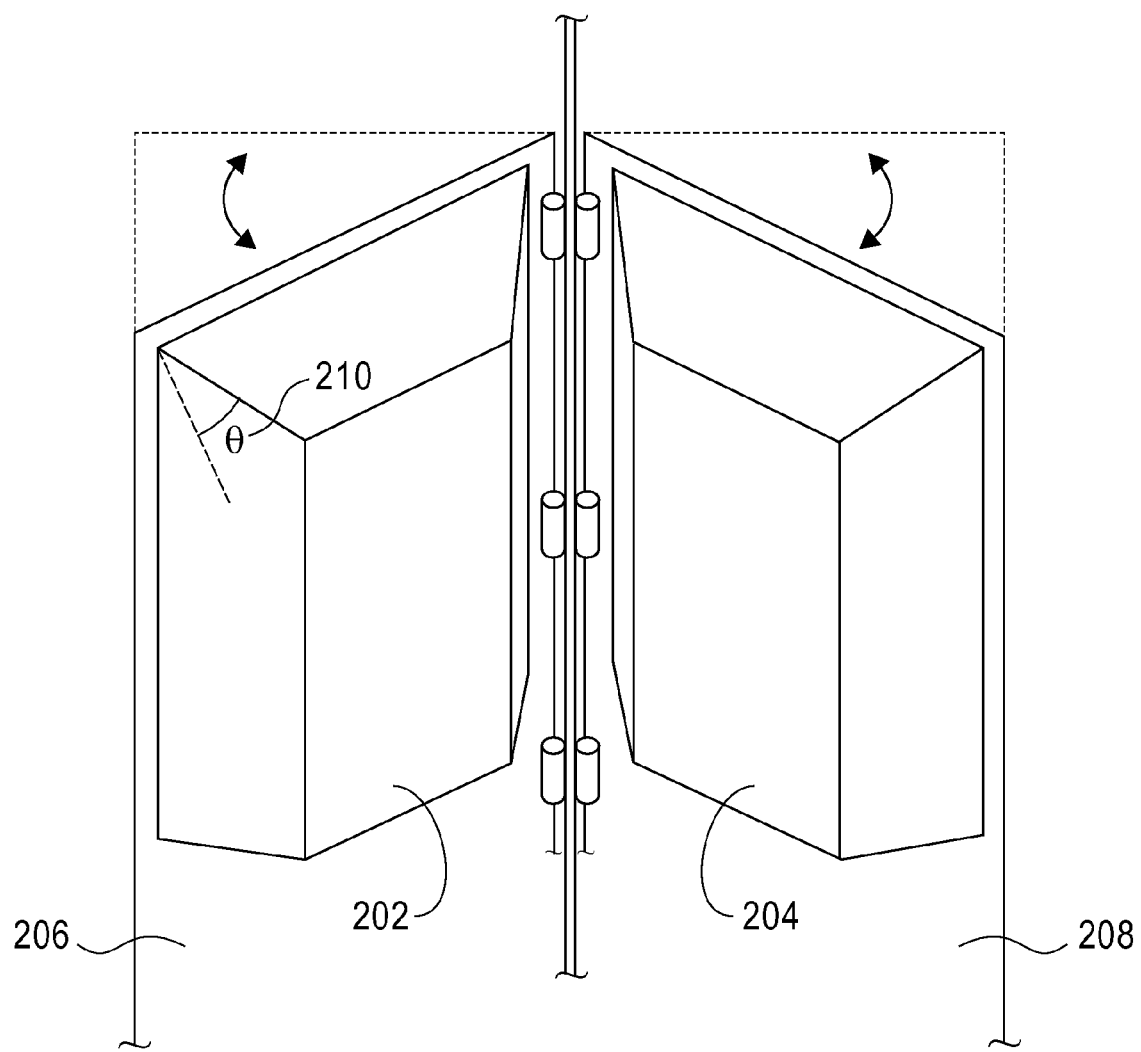
FIG. 2 is a diagram illustrating an exemplary air inlet redirection duct configuration according to an embodiment of the present invention.

As highlighted above, air redirection duct configurations are considered herein that permit the opening and closing of computer equipment rack doors while the air redirection duct remains mounted to the computer equipment rack. One such configuration is shown in FIG. 2, wherein air inlet redirection ducts 202 and 204 are mounted on side-by-side computer equipment doors 206 and 208, respectively. As shown in FIG. 2, air inlet redirection ducts 202 and 204 each have beveled sides to provide clearance for doors 206 and 208 to open without interference from the air inlet redirection ducts. By way of example only, the sides can be beveled at an angle 210 of up to about 75 degrees, for example, about 45 degrees. For ease of description, FIG. 2 is presented in the context of air inlet redirection ducts, however, the teachings are intended to apply to air redirection ducts in general and include air exhaust redirection ducts as described below.

Figure 3:
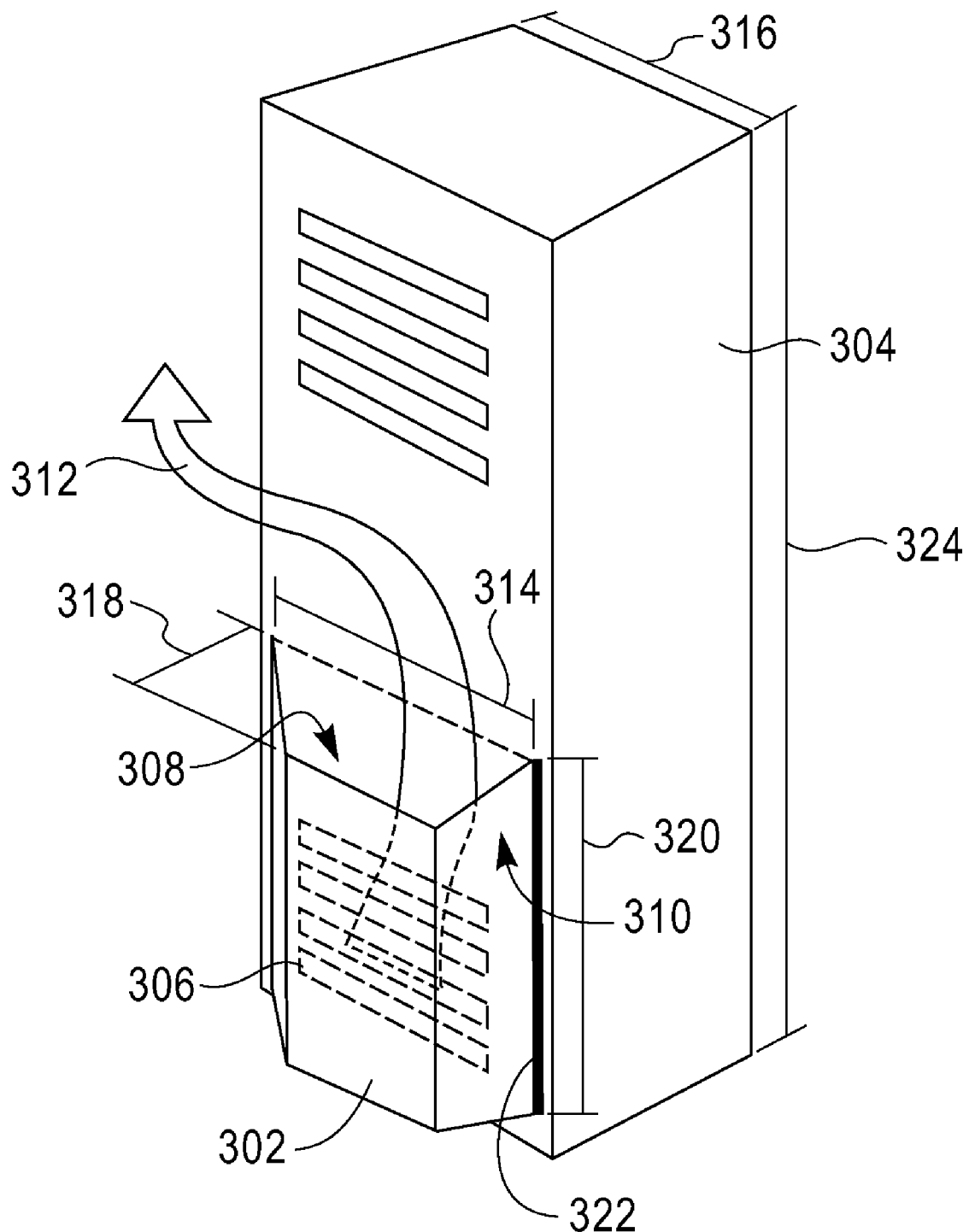
FIG. 3 is a diagram illustrating a computer equipment rack having an exemplary air exhaust redirection duct mounted thereto according to an embodiment of the present invention.

FIG. 3 is a diagram illustrating exemplary computer equipment rack 304 having air exhaust redirection duct 302 mounted thereto. As will be described in detail below, an air exhaust redirection duct can increase the efficiency of a data center cooling system by helping to minimize, or eliminate, exhaust-to-inlet flow effects.

Computer equipment rack 304 comprises air outlet ports, perforations, vents, holes or slots (hereinafter "exhaust outlets"), e.g., exhaust outlets 306, through which heated air is expelled from the computer equipment therein. Exhaust outlets typically found on computer equipment are well known to those of ordinary skill in the art, and are not described further herein.

Air exhaust redirection duct 302, when mounted to computer equipment rack 304 so as to surround at least a portion of exhaust outlets 306, provides a continuous exhaust air passageway from exhaust outlets 306 through open side 310/ open end 308, e.g., as indicated by arrow 312. Like air inlet redirection duct 102, described above, air exhaust redirection duct 302 is a partial duct structure in that air exhaust redirection duct 302 has a length 320 that is less than a length 324 of computer equipment rack 304, such that air exhaust redirection duct 302, extends along only a portion of length 324 of computer equipment rack 304. According to an exemplary embodiment, air exhaust redirection duct 302 has a length 320 that is less than or equal to about 0.5 times the length 324 of computer equipment rack 304.

According to an exemplary embodiment, air exhaust redirection duct 302 has a lateral dimension 314 that approximates, e.g., is up to about three inches less than, a lateral dimension 316 of computer equipment rack 304. For example, lateral dimension 314 of air exhaust redirection duct 302 can equal lateral dimension 316 of computer equipment rack 304. As described above, a typical lateral dimension of a computer equipment rack, e.g., lateral dimension 316 of computer equipment rack 304, is about 24 inches. Thus, in that instance, lateral dimension 314 of air exhaust redirection duct 302 can also equal about 24 inches. A depth 318, a length 320 and a cross-sectional area of air exhaust redirection duct 302 are chosen to allow a desired air flow to occur therethrough. By way of example only, a depth 318 of about six inches to about 12 inches, a length 320 of about 3.5 feet and a cross-sectional area, e.g., a cross-sectional area of open end 308 (shown in FIG. 3 as being, for example, trapezoidal in shape), of from about one square foot to about two square feet can be employed.

Figure 5:
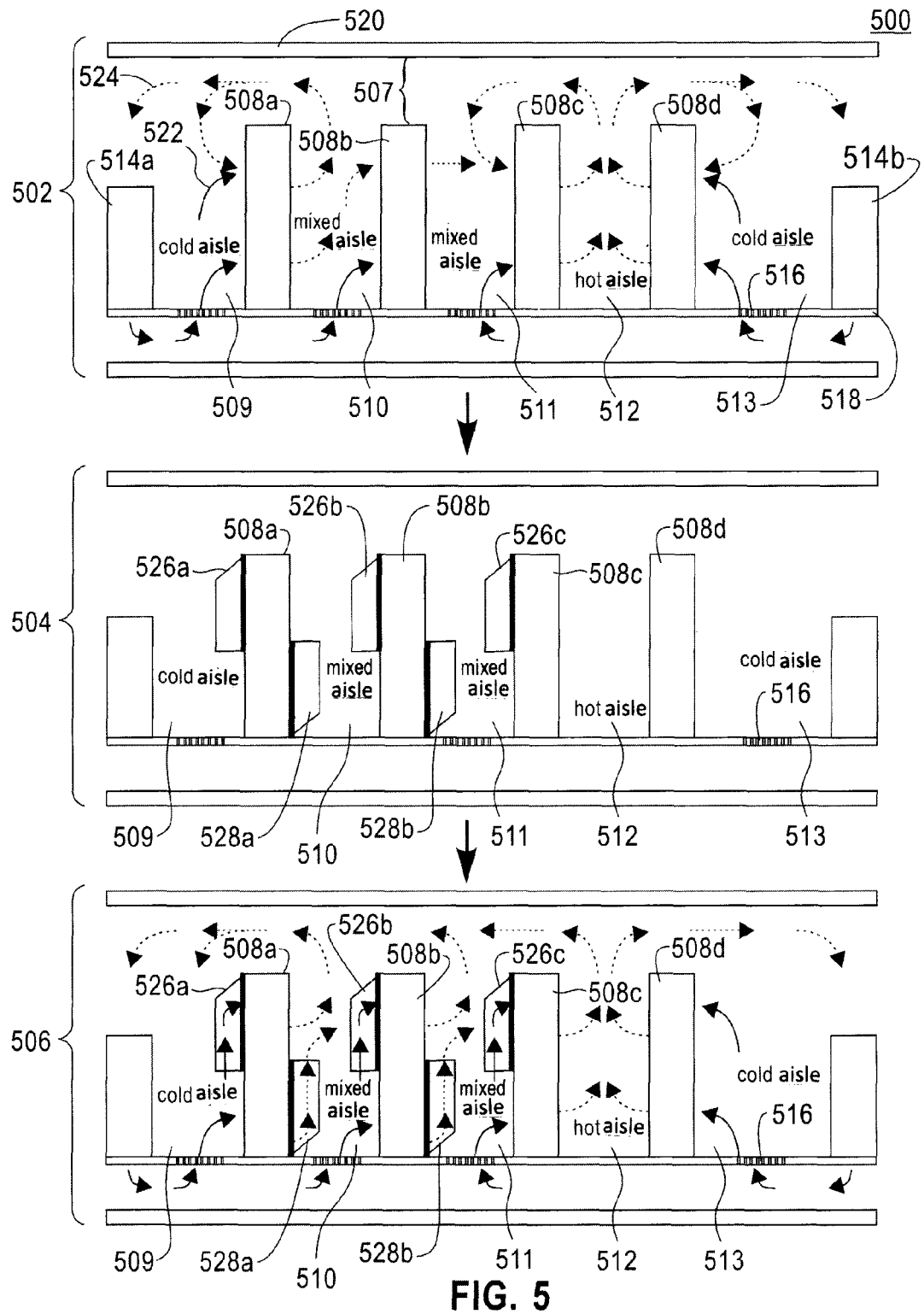
FIG. 5 is a diagram illustrating an exemplary methodology for cooling in a data center having violations of the hot aisle/cold aisle configuration according to an embodiment of the present invention.

As will be described in detail below, in some configurations, air inlet redirection ducts are used in combination with air exhaust redirection ducts to affect air flow in a data center. According to one exemplary embodiment wherein this configuration is employed, the air inlet redirection ducts have the same dimensions, e.g., the same lateral dimension, depth, length and cross-sectional area, as the air exhaust redirection ducts. For example, the air inlet redirection ducts and the air exhaust redirection ducts can comprise the same structure, with different positioning, orientation and location on the computer equipment racks, e.g., as shown in FIG. 5 and as described below.

Like with air inlet redirection duct 102/computer equipment rack 104, air exhaust redirection duct 302 can be mounted to computer equipment rack 304 in a removable, semi-permanent manner using mechanical fasteners such as clips, screws, nuts, rivets, hinges, hooks or other mechanical fasteners, by magnetic fasteners such as magnetic strip 322 that is glued or mechanically joined using screws or other mechanical fasteners to air exhaust redirection duct 302 along its rim, e.g., three perimeter edges of air exhaust redirection duct 302 that are adjacent to and abut computer equipment rack 304 (see, for example, FIG. 3 wherein one of the three perimeter edges is visible) or using, a series of magnetic rings and bars, or by a combination of magnetic and mechanical fasteners, such as magnetic plates with hooks from which the air exhaust redirection duct can hang (as described, for example, in conjunction with the description of FIG. 1, above). Depending on the amount of airflow, static pressure may require that the air exhaust redirection duct be mounted to the computer equipment rack using mechanical fasteners. Air exhaust redirection duct 302 can be composed of any suitable material, including, but not limited to, one or more of a rigid sheet material, such as aluminum, steel, plastic, fiberboard, fiberglass, carbon fiber composite and Kevlar® fiber composite, and a transparent material, such as PMMA, e.g., plexiglass(I&, and polycarbonate.

Air exhaust redirection duct 302 can also comprise one or more internal structures, such as plates, baffles or penetrations therein (not shown) to affect, i.e., adjust or modify, air flow through the air exhaust redirection duct. These internal structures are optional.

Further, as highlighted above., air exhaust redirection duct 302 can be configured, e.g., having beveled sides, to permit the opening and closing of computer equipment rack doors while air exhaust redirection duct 302 remains mounted to computer equipment rack 304. This configuration was described in conjunction with the description of FIG. 2, above.

Figure 4:
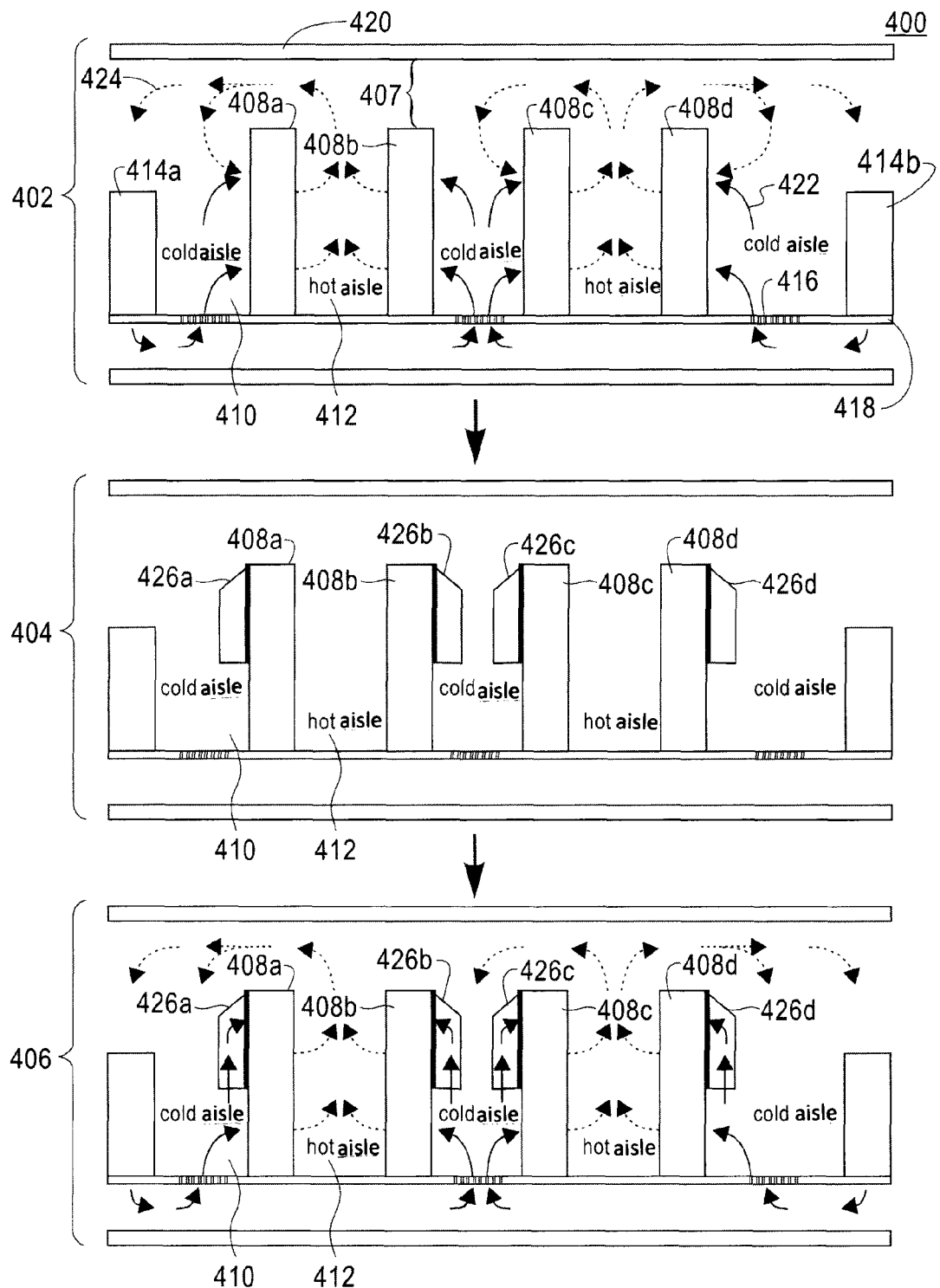
FIG. 4 is a diagram illustrating an exemplary methodology for cooling in a data center having a hot aisle/cold aisle configuration according to an embodiment of the present invention.

FIG. 4 is a diagram illustrating exemplary methodology 400 for cooling in a data center. The data center is arranged in a hot aisle/cold aisle configuration, wherein computer equipment racks 408a-d are positioned to draw cooling air from cold aisles, e.g., cold aisle 410, and to discharge heated air into hot aisles, e.g., hot aisle 412.

In step 402, an air cooling system is provided. The air cooling system comprises computer air conditioning (CAC) units 414a and 414b that provide cooled air to computer equipment racks 408a-d through perforated tiles 416 in raised floor 418. Air flow through the data center is illustrated by arrows 422 and 424, wherein solid arrows 422 indicate cooled air flow and dashed arrows 424 indicate heated air flow through the data center. As shown in FIG. 4, the cooled air supplied by CAC units 414a and 414b is drawn into the computer equipment through the air inlets (as described above). The heated air expelled from the computer equipment through the exhaust outlets (as described above) travels along ceiling region 407 (i.e., an area defined between a top of computer equipment racks 408a-d and ceiling 420) back to CAC units 414a and 414b, completing a full cooling cycle through the data center.

As shown in FIG. 4, air recirculation can occur when heated air flows down from the ceiling region 407 and is drawn back into computer equipment racks 408a-d. For example, recirculation occurs between aisles 410 and 412, wherein a portion of the heated air expelled from computer equipment rack 408a into hot aisle 412 flows down from ceiling region 407 into cold aisle 410, and is drawn back into computer equipment rack 408a without passing through CAC unit 414a. Due to the progressive flow of air from floor 418 to ceiling 420, recirculation is most likely to affect the computer equipment located on upper levels of computer equipment racks 408a-d. Further, a portion of the cooled air (not shown) can bypass the air inlets all together and get cycled, i.e., back through the CAC units, without passing through the racks/equipment.

The recirculation effect is compounded by the notion that, in general, temperatures rise significantly as one proceeds from floor 418 to ceiling 420. For example, temperatures can increase at a rate of from about five degrees Celsius (° C.), per foot, in some cases, as one proceeds from floor 418 to ceiling 420. Circulating heated air into the computer equipment on the upper levels of computer equipment racks 408a-d impacts on overall cooling efficiency.

In step 404, air inlet redirection ducts 426a-d are installed over air inlets on computer equipment racks 408a-d, respectively. As described above, air inlet redirection ducts serve to minimize air recirculation effects and to prevent cooled air from being cycled without passing through the equipment. The air inlet redirection ducts 426a-d are positioned to extend down from the tops of computer equipment racks 408a-d, where recirculation effects are the greatest. As described above, the air inlet redirection ducts can be semi-permanently attached to the computer equipment racks. e.g., using a magnetic strip, thus allowing for positioning adjustments.

In step 406, the air inlet redirection ducts redirect incoming air flow at the air inlets, i.e., redirecting cooled air towards the air inlets and redirecting heated air away from the air inlets. Since recirculation occurs primarily on the upper levels of computer equipment racks 408a-d, as described above, air inlet redirection ducts 426a-d effectively relocate the air inlets from the upper levels of computer equipment racks 408a-d to lower levels, from which cooler air can be drawn. Air inlet redirection ducts 426a-d also serve to redirect cooled air, towards the air inlets, that might otherwise get cycled without passing through the equipment. Further, air inlet redirection ducts 426a-d surround at least a portion of the air inlets, thus effectively blocking recirculation air flow from above.

FIG. 5 is a diagram illustrating exemplary methodology 500 for cooling in a data center. The data center is arranged having violations of the hot aisle/cold aisle configuration. Specifically, while computer equipment rack 508a is positioned to draw cooling air from cold aisle 509, computer equipment rack 508a discharges heated air into aisle 510, the same aisle from which computer equipment rack 508b draws cooled air, i.e., making aisle 510 a mixed aisle. The term "mixed aisle," as used herein, refers to an aisle wherein heated discharged air is mixed with cooled air. As such, the heated discharged air from computer equipment rack 508a mixes with the cooled air supplied to computer equipment rack 508b, i.e., through perforated tiles 516 (as described in detail below). The same configuration is present between computer equipment racks 508b and 508c, also making aisle 511a mixed aisle. Computer equipment rack 508c is positioned relative to computer equipment rack 508d to form aisles 512 and 513, a hot aisle and a cold aisle, respectively, thus conforming to a hot aisle/cold aisle configuration.

In step 502, an air cooling system is provided. The air cooling system comprises CAC units 514a and 514b that provide cooled air to computer equipment racks 508a-d through perforated tiles 516 in raised floor 518. Air flow through the data center is illustrated by arrows 522 and 524, wherein solid arrows 522 indicate cooled air flow and dashed arrows 524 indicate heated air flow through the data center. The cooled air is drawn into the computer equipment through the air inlets (as described above). Hot air expelled from the computer equipment through the exhaust outlets (as described above) travels along ceiling region 507 (i.e., an area defined between a top of computer equipment racks 508a-d and ceiling 520) back to CAC units 514a and 514b, completing an air flow cycle through the data center.

As shown in FIG. 5, air recirculation can occur when heated air flows down from the ceiling region 507 and is drawn back into computer equipment racks 508a-d. Further, a portion of the cooled air (not shown) can bypass the air inlets all together and get cycled, i.e., back through the CAC units, without passing through the racks/equipment. Air recirculation effects and cycling air that has bypassed the equipment are described, for example, in conjunction with the description of FIG. 4, above. Further, due to the presence of mixed aisles, exhaust-to-inlet flow (i.e., discharged heated air being drawn into the air inlets of an adjacent computer equipment rack) can occur. This effect is shown, for example, with regard to computer equipment racks 508a and 508b. Namely, some of the discharged heated air from computer equipment rack 508a is drawn into the air inlets of computer equipment rack 508b. Air recirculation and exhaust-to-inlet flow can occur at the same time. This effect is shown, for example, with regard to computer equipment rack 508c, wherein recirculated air, as well as, discharged heated air from computer equipment rack 508b, are both being supplied to computer equipment rack 508c.

In step 504, air inlet redirection ducts 526a-c are installed over air inlets on computer equipment racks 508a-c, respectively, and air exhaust redirection ducts 528a and 528b are installed over exhaust outlets on computer equipment racks 508a and 508b, respectively. Air inlet redirection ducts 526a-c are positioned to extend down from the tops of computer equipment racks 508a-c, respectively, where recirculation effects are the greatest. Air exhaust redirection ducts 528a and 528b are positioned to extend up from the bottoms of computer equipment racks 508a and 508b, respectively, and, as described above, serve to minimize exhaust-to-inlet flow. Additionally, an air inlet redirection duct (not shown) can be installed over air inlets on computer equipment rack 508d, e.g., so as to address recirculation effects and prevent cycling air that has bypassed the equipment (as described in conjunction with the description of FIG. 4, above). As also described above, the air inlet redirection ducts and the air exhaust redirection ducts can be semi-permanently attached to the computer equipment racks, e.g., using (a magnetic strip, thus allowing for positioning adjustments.

In step 506, the air inlet redirection ducts redirect incoming air flow at the air inlets, i.e., redirecting cooled air towards and heated air away from the air inlets, and the air exhaust redirection ducts redirect outgoing air flow at the exhaust outlets, i.e., redirecting heated air away from the air inlets. Air inlet redirection ducts 526a-c serve to minimize air recirculation effects and to prevent cooled air from being cycled without passing through the equipment. Further, in mixed aisles, such as aisles 510 and 511, air inlet redirection ducts 526b and 526c (in combination with air exhaust redirection ducts 528a and 528b), respectively, serve to minimize, or eliminate, exhaust-to-inlet flow. Namely, air exhaust redirection ducts 528a and 528b effectively relocate the exhaust outlets of computer equipment racks 508a and 508b, respectively, above a height from which computer equipment racks 508b and 508c draw cooled air (via air inlet redirection ducts 526b and 526c, respectively). As shown in FIG. 5, air exhaust redirection ducts 528a and 528b further serve to divert cooled air from vents 516 towards air inlet redirection ducts 526b and 526c, respectively, increasing the efficiency of the cooling system by minimizing the amount of cooled air that is cycled without passing through the computer equipment racks.

Figure 6:
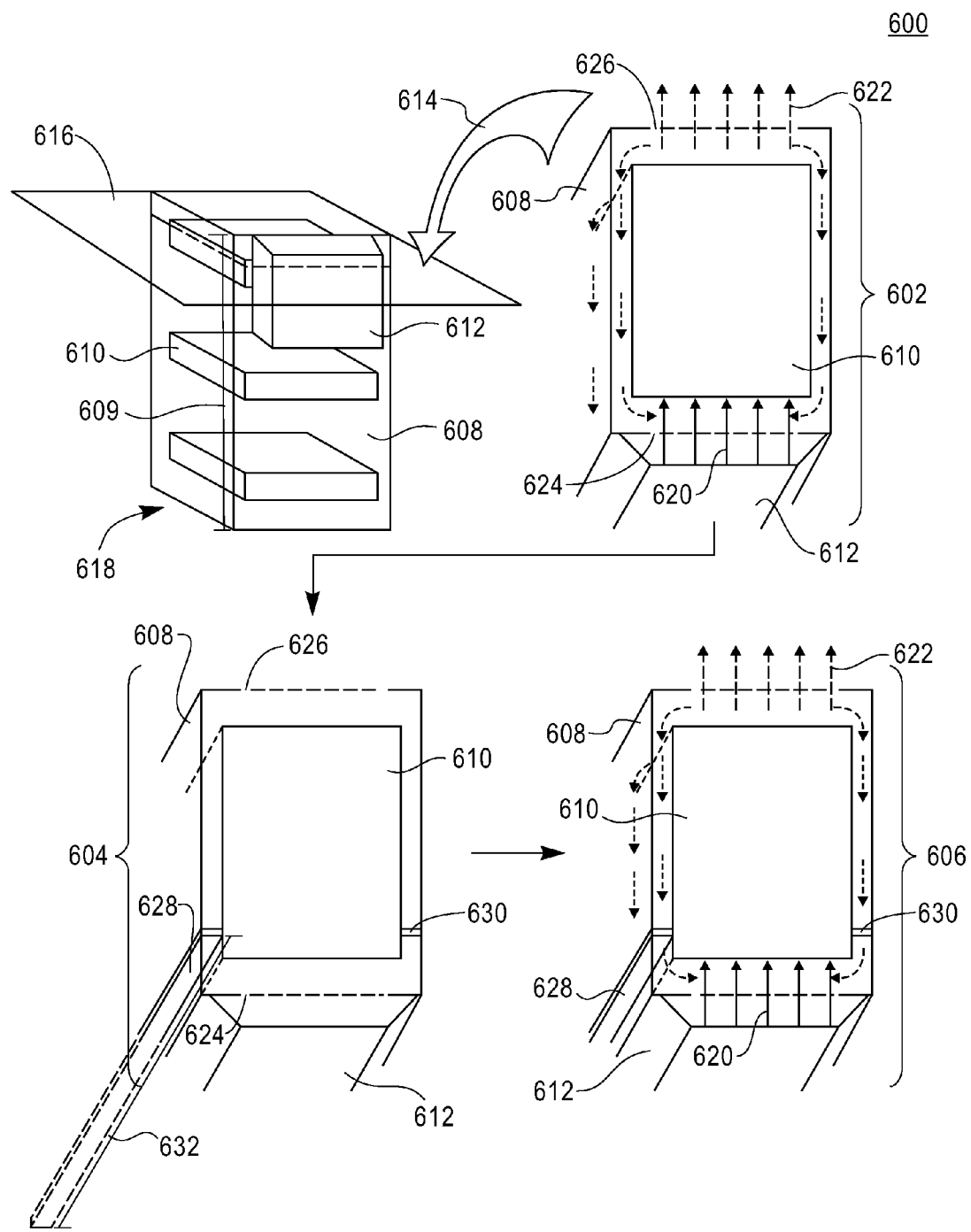
FIG. 6 is a diagram illustrating an exemplary methodology for optimizing air flow within a computer equipment rack having an air redirection duct mounted thereto according to an embodiment of the present invention.

FIG. 6 is a diagram illustrating exemplary methodology 600 for optimizing air flow within rack 608. Rack 608 has computer equipment 610 therein and air inlet redirection duct 612 mounted thereto.

The steps of methodology 600 are depicted in FIG. 6 from a top-down cut-away view 614 across plane 616, e.g., as indicated by orientation guide 618. In step 602, an air flow is provided through rack 608, i.e., an internal air flow. Air flow through rack 608 is illustrated by arrows 620 and 622, wherein solid arrows 620 indicate cooled air flow and dashed arrows 622 indicate heated air flow through rack 608. Specifically, incoming cooled air is drawn into rack 608 through air inlet redirection duct 612 (via air inlets 624), and passes through computer equipment 610. While some of the heated air exhausted from computer equipment 610 passes out from rack 608 (via exhaust outlets 626), a portion of this heated air travels through passageways that extend between a front/back and sides of computer equipment 610 and an inner front/back and inner sides of rack 608, and gets recirculated back through computer equipment 61(0. Recirculating heated air within rack 608 impacts cooling efficiency.

In step 604, air-blocking baffles, i.e., panel blanks 628 and 630, are placed in the passageways between the sides of computer equipment 610 and the inner sides of rack 608. Specifically, each of panel blanks 628 and 630 extends along an inner length of rack 608 and blocks the passageways between the sides of computer equipment 610 and the inner sides of rack 608. The term "inner length," as compared to, e.g., length 124 (described above), is intended to refer to a length measurement based on interior dimensions of a computer equipment rack, whereas length 124, for example, is based on outer, exterior dimensions of a computer equipment rack. According to an exemplary embodiment, panel blanks 628 and 630 are configured to have a length, e.g., length 632, that is the same as an inner length 609 of rack 608 (see orientation guide 618), so as to extend along the entire inner length of rack 608. Further, as shown in FIG. 6, panel blanks 628 and 630) are positioned in the passageways proximal to air inlet redirection duct 612/air inlets 624 so as to minimize amounts of cooled air flow, if any, that enters the passageways.

Panel blanks 628 and 630 can be made of any suitable material, including, but not limited to, one or more of, aluminum, steel, plastic, fiberboard, PMMA, e.(g., Plexiglass®, and polycarbonate. Panel blanks 628 and 630 can be mounted to rack 608 and/or computer equipment 610 in a permanent or removable, semi-permanent manner using clips, screws, nuts, rivets, hinges, hooks or other mechanical fasteners, adhesives, magnetic fasteners (e.g., by way of a magnetic strip or magnetic rings and bars) or a combination of magnetic and mechanical fasteners, as described above.

In step 606, air flow within rack 608 is redirected by panel blanks 628 and 630. Namely, heated air flow (as indicated by arrows 622) is blocked from being recirculated back through computer equipment 610. The use of panel blanks 628 and 630 constrains the intake air, e.g., to come only from air inlet redirection duct 612, thus enhancing the efficiency of an air cooling system.

In FIG. 6, for ease of depiction, only an air inlet redirection duct is shown. It is to be understood, however, that (as described above) an air exhaust redirection duct can also be mounted to the rack. Further, panel blanks 628 and 630 can be used alone, or in combination with any one of the other panel blanks that are described, for example, in conjunction with the description of FIGS. 7 and 8, below.

Figure 7:
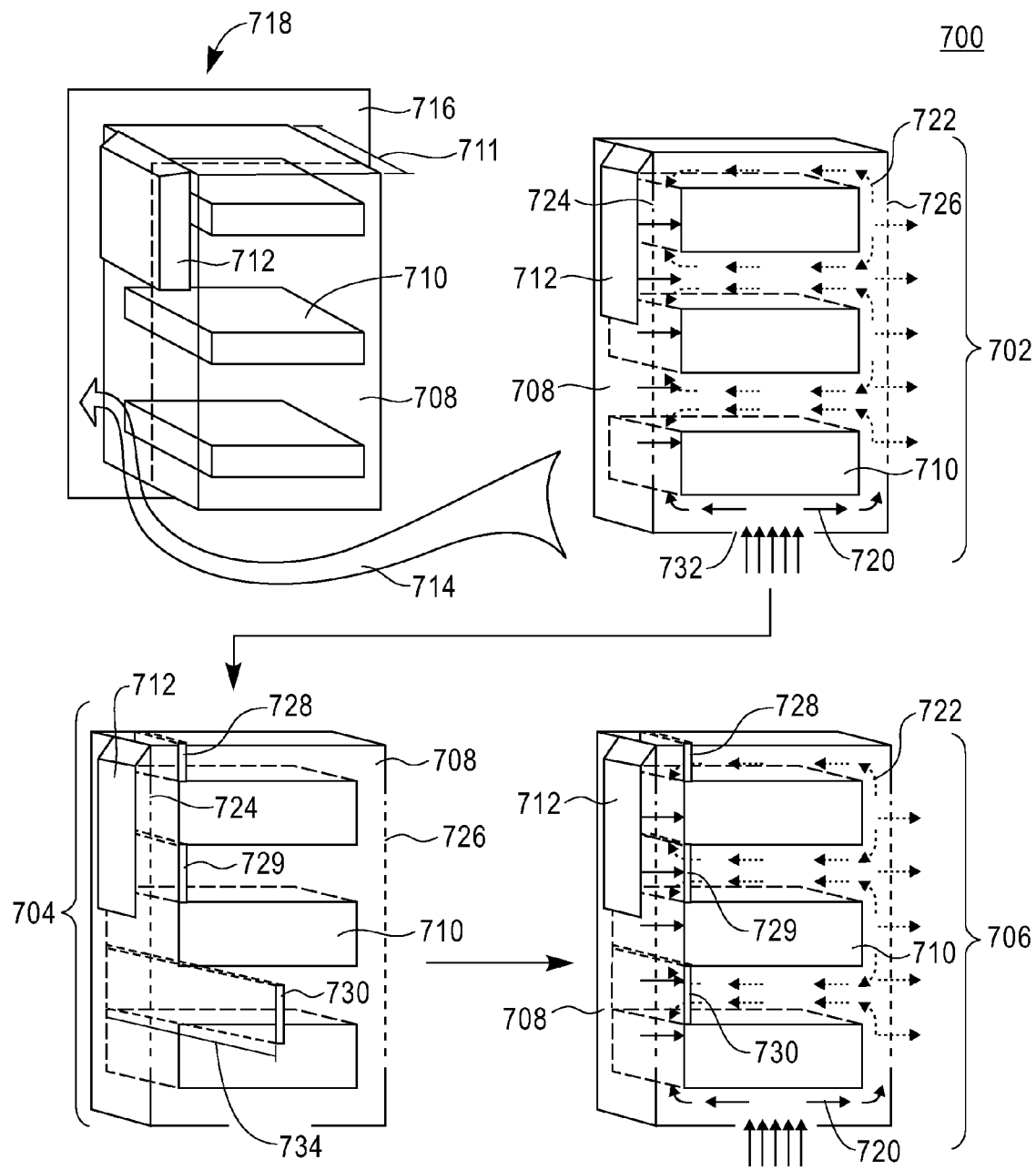
FIG. 7 is a diagram illustrating another exemplary methodology for optimizing air flow within a computer equipment rack having an air redirection duct mounted thereto according to an embodiment of the present invention.

FIG. 7 is a diagram illustrating exemplary methodology 700 for optimizing air how within rack 708. Rack 708 has computer equipment 710 therein and air inlet redirection duct 712 mounted thereto.

The steps of methodology 700 are depicted in FIG. 7 from a center cut-away side view 714 across plane 716, e.g., as indicated by orientation guide 718. In step 702, an air flow is provided through rack 708, i.e., an internal air flow. Air flow through rack 708 is illustrated by arrows 720 and 722, wherein solid arrows 720 indicate cooled air flow and dashed arrows 722 indicate heated air flow through rack 708. Specifically, incoming cooled air is drawn into rack 708 through air inlet redirection duct 712 (via air inlets 724), and passes through computer equipment 710. Cooled air also leaks into rack 708 through cable opening(s) 732, i.e., when rack 708 is placed in a data center, e.g., having a raised floor with perforated tiles for providing cooled air from below (as described above). While some of the heated air exhausted from computer equipment 710 passes out from rack 708 (via exhaust outlets 726), a portion of this heated air travels through passageways that extend between the computer equipment 710 themselves and/or empty slots in rack 708, and passageways that extend between a front/back and top of computer equipment 710 and an inner front/back and top of rack 708, and gets recirculated back through computer equipment 710. Recirculating heated air within rack 708 impacts cooling efficiency.

In step 704, air-blocking baffles, i.e., panel blanks 728, 729 and 730, are placed in the above-described passageways. Specifically, panel blank 728 extends along an inner lateral dimension of rack 708 and blocks the passageway between the top of computer equipment 710 and the inner top of rack 708, and each of panel blanks 729 and 730 extends along the inner lateral dimension of rack 708 and blocks the passageways between the computer equipment 710 themselves and/or empty slots in rack 708. The term "inner lateral dimension," as compared to, e.g., lateral dimension 116 (described above), is intended to refer to a lateral dimension measurement based on interior dimensions of a computer equipment rack, whereas lateral dimension 116, for example, is based on outer, exterior dimensions of a computer equipment rack. According to an exemplary embodiment, panel blanks 728, 729 and 730 are configured to have a length, e.g., length 734, that is the same as inner lateral dimension 711 of rack 708 (see orientation guide 718), so as to extend along the entire inner lateral dimension of rack 708. Further, as shown in FIG. 7, panel blanks 728, 729 and 730 are positioned in the passageways proximal to air inlet redirection duct 712/air inlets 724 so as to minimize amounts of cooled air flow, if any, that enters the passageways.

Panel blanks 728, 729 and 730 can be made of any suitable material, including, but not limited to, one or more of, aluminum, steel, plastic, fiberboard, PMMA, e.g., Plexiglass®, and polycarbonate. Panel blanks 728, 729 and 730 can be mounted to rack 708 and/or computer equipment 710 in a permanent or removable, semi-permanent manner using clips, screws, nuts, rivets, hinges, hooks or other mechanical fasteners, adhesives, magnetic fasteners (e.g., by way of a magnetic strip or magnetic rings and bars) or a combination of magnetic and mechanical fasteners, as described above.

In step 706, air flow within rack 708 is redirected by panel blanks 728, 729 and 730. Namely, heated air flow (as indicated by arrows 722) is blocked from being recirculated back through computer equipment 710. The use of panel blanks 728, 729 and 730 constrains the intake air, e.g., to come only from air inlet redirection duct 712, thus enhancing the efficiency of an air cooling system.

In FIG. 7, for ease of depiction, only an air inlet redirection duct is Shown. It is to be understood, however, that (as described above) an air exhaust redirection duct can also be mounted to the rack. Further, panel blanks 728, 729 and 730 can be used alone, or in combination with any one of the other panel blanks that are described, for example, in conjunction with the description of FIG. 6, above, and FIG. 8, below.

Figure 8:
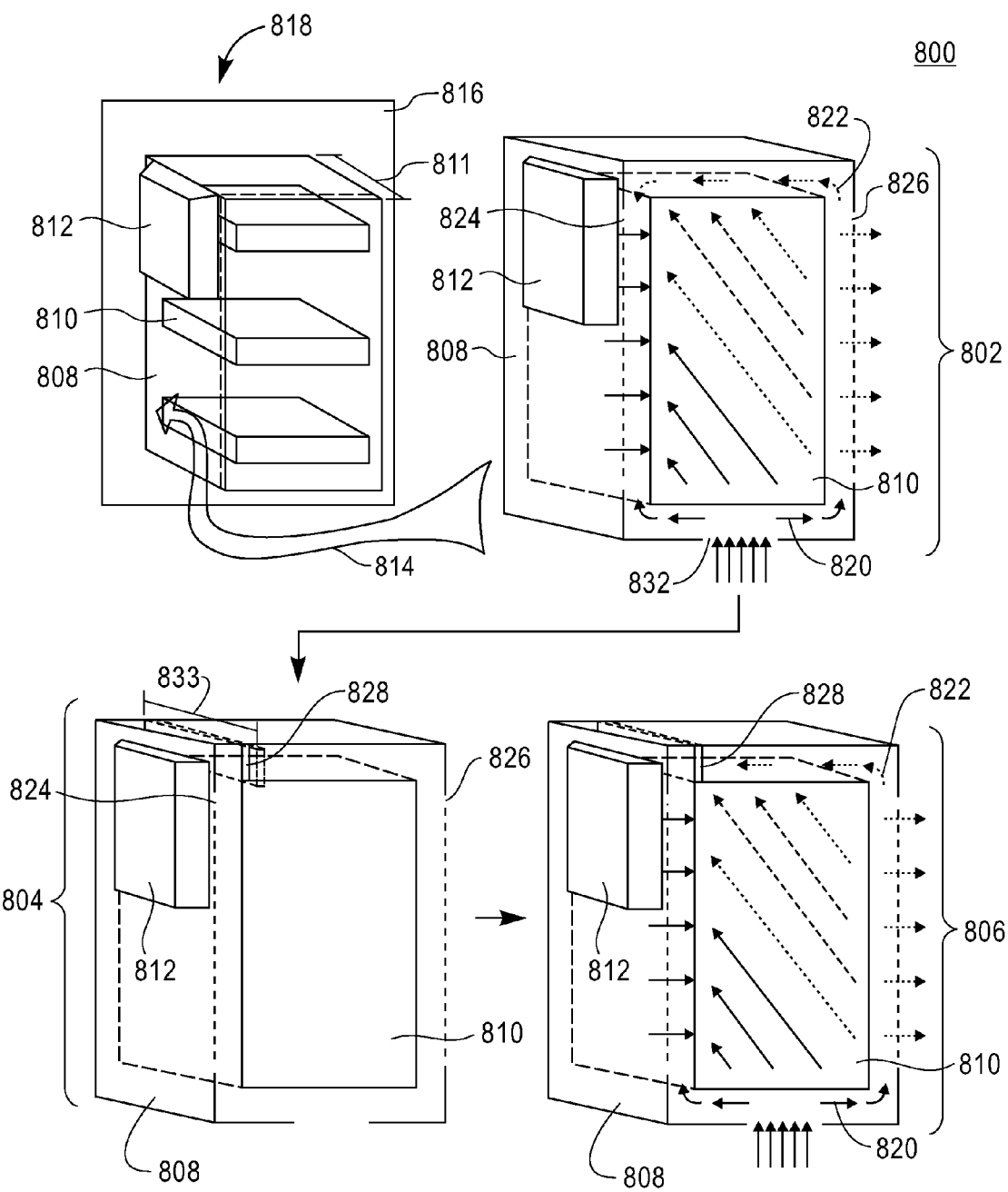
FIG. 8 is a diagram illustrating yet another exemplary methodology for optimizing air flow within a computer equipment rack having an air redirection duct mounted thereto according to an embodiment of the present invention.

FIG. 8 is a diagram illustrating exemplary methodology 800 for optimizing air flow within rack 808. Rack 808 has computer equipment 810 therein and air inlet redirection duct 812 mounted thereto.

The steps of methodology 800 are depicted in FIG. 8 from a cut-away side view 814 across plane 816. e.g., as indicated by orientation guide 818. For ease of depicting air flow through rack 808, computer equipment 810 is presented in steps 802-806 as a single computer equipment unit. However, computer equipment 810 can comprise multiple computer equipment units, i.e., in a stacked configuration, as shown, for example, by orientation guide 818. In step 802, an air flow is provided through rack 808, i.e., an internal air flow. Air flow through rack 808 is illustrated by arrows 820 and 822, wherein solid arrows 820 indicate cooled air flow and dashed arrows 822 indicate heated air flow through rack 808. Specifically, incoming cooled air is drawn into rack 808 through air inlet redirection duct 812 (via air inlets 824), and passes through computer equipment 810. Cooled air also leaks into rack 808 through cable opening(s) 832, i.e., when rack 808 is placed in a data center, e.g., having a raised floor with perforated tiles for providing cooled air from below (as described above). While some of the heated air exhausted from computer equipment 810 passes out from rack 808 (via exhaust outlets 826), a portion of this heated air travels through passageways that extend between sides of the computer equipment 810 and inner sides of rack 808 and gets recirculated back through computer equipment 810. Recirculating heated air within rack 808 impacts cooling efficiency.

In step 804, an air-blocking baffle, i.e., panel blank 828, is placed in the above-described passageways. Specifically, panel blank 828 extends along an inner lateral dimension of rack 808 and blocks the passageways between the sides of the computer equipment 810 and the inner sides of the rack 808. According to an exemplary embodiment, panel blank 828 is configured to have a length, e.g., length 833, that is the same as inner lateral dimension 811 of rack 808 (see orientation guide 818), so as to extend along the entire inner lateral dimension of rack 808. Further, as shown in FIG. 8, panel blank 828 is positioned in the passageway proximal to air inlet redirection duct 812/air inlets 824, so as to minimize amounts of cooled air flow, if any, that enters the passageway.

Panel blank 828 can be made of any suitable material, including, but not limited to, one or more of, aluminum, steel, plastic, fiberboard, PMMA, e.g., plexiglass(t), and polycarbonate. Panel blank 828 can be mounted to rack 808 and/or computer equipment 810 in a permanent or removable, semi-permanent manner using clips, screws, nuts, rivets, hinges, hooks or other mechanical fasteners, adhesives, magnetic fasteners (e.g., by way of a magnetic strip or magnetic rings and bars) or a combination of magnetic and mechanical fasteners, as described above.

In step 806, air flow within rack 808 is redirected by panel blank 828. Namely, heated air flow (as indicated by arrows 822) is blocked from being recirculated back through computer equipment 810. The use of panel blank 828 constrains the intake air, e.g., to come only from air inlet redirection duct 812, thus enhancing the efficiency of an air cooling system.

In FIG. 8, for ease of depiction, only an air inlet redirection duct is shown. It is to be understood, however, that (as described above) an air exhaust redirection duct can also be mounted to the rack. Further, panel blank 828 can be used alone, or in combination with any one of the other panel blanks that are described, for example, in conjunction with the description of FIGS. 6 and 7, above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of cooling in a data center having computer equipment racks with computer equipment therein, the computer equipment racks being arranged in a series of rows, defining a series of aisles, each computer equipment rack having air inlets and exhaust outlets, the method comprising the steps of:
   to each of one or more of the computer equipment racks, mounting one or more of:
      an air inlet duct surrounding at least a portion of the air inlets, the air inlet duct having a lateral dimension that approximates a lateral dimension of the computer equipment rack and an entire length that is less than a length of the computer equipment rack, and
      an air exhaust duct surrounding at least a portion of the exhaust outlets, the air exhaust duct having a lateral dimension that approximates the lateral dimension of the computer equipment rack and an entire length that is less than the length of the computer equipment rack, the air inlet duct and the air exhaust duct being composed of a transparent material,
   wherein one or more of the computer equipment racks have doors on at least a front and a back thereof, one of the doors containing the air inlets and another one of the doors containing the exhaust outlets, and wherein one or more of the air inlet duct and the air exhaust duct are mounted to the doors of each of the computer equipment racks with doors, each of the air inlet ducts and air exhaust ducts mounted to the doors of the computer equipment racks with doors having beveled sides along the entire length thereof to allow the doors to be opened without interference from the air inlet ducts and air exhaust ducts mounted to the computer equipment racks adjacent thereto;
   to at least one of the computer equipment racks having an air inlet duct mounted thereto, inserting:
      at least one air-blocking baffle along at least a portion of an inner length of the computer equipment rack to block one or more air passageways between sides of the computer equipment and inner sides of the computer equipment rack,
      at least one air-blocking baffle along at least a portion of an inner lateral dimension of the computer equipment rack to block one or more air passageways between a top of the computer equipment and an inner top of the computer equipment rack, and
      at least one air-blocking baffle along at least a portion of an inner lateral dimension of the computer equipment rack to block one or more air passageways between the sides of the computer equipment and the inner sides of the computer equipment rack;
   cycling air through the data center;
   redirecting one or more of an incoming air flow at one or more of the air inlets and an outgoing air flow at one or more of the exhaust outlets; and
   by way of the air-blocking baffles, constraining at least a portion of the incoming air flow to air flow coming from the air inlet duct.

2. The method of claim 1, wherein the redirecting step further comprises the steps of:
   redirecting cooled air towards one or more of the air inlets; and
   redirecting heated air away from one or more of the air inlets.

3. The method of claim 1, further comprising the step of:
   providing an air cooling system having one or more computer air conditioning units that provide cooled air to the computer equipment racks.

4. The method of claim 3, further comprising the step of:
   using the air inlet ducts mounted to the computer equipment racks to prevent the cooled air from being cycled through the computer air conditioning units without passing through the computer equipment racks.

5. The method of claim 1, wherein the computer equipment racks are positioned to draw cooling air from one or more cold aisles and to discharge heated air into one or more hot aisles, the method further comprising the step of:
   using the air inlet ducts mounted to the computer equipment racks to block recirculation of heated air to the air inlets.

6. The method of claim 1, wherein the computer equipment racks are positioned such that at least one computer equipment rack draws cooled air from a same aisle into which at least one other computer equipment rack discharges heated air, the method further comprising the step of:
   using the air exhaust ducts mounted to the computer equipment racks to prevent exhaust-to-inlet air flow.

7. The method of claim 1, further comprising the step of:
   semi-permanently attaching the air inlet ducts and air exhaust ducts to the computer equipment racks thus allowing for positioning adjustments.

8. The method of claim 1, wherein the air inlet ducts and air exhaust ducts are semi-permanently attached to the computer equipment racks using magnetic strips.

9. The method of claim 1, further comprising the step of:
   providing an internal air flow through the computer equipment racks.

10. The method of claim 1, wherein the at least one air-blocking baffle that blocks the one or more air passageways between the sides of the computer equipment and the inner sides of the computer equipment rack extends along the entire inner length of the computer equipment rack.

11. The method of claim 1, further comprising the step of:
   positioning the at least one air-blocking baffle that blocks the one or more air passageways between the sides of the computer equipment and the inner sides of the computer equipment rack along at least a portion of the inner length of the computer equipment rack proximal to the air inlet duct.

12. The method of claim 1, further comprising the step of:
semi-permanently mounting the at least one air-blocking baffle that blocks the one or more air passageways between the sides of the computer equipment and the inner sides of the computer equipment rack along at least a portion of the inner length of the computer equipment rack.

13. The method of claim 1, further comprising the steps of:
semi-permanently mounting the at least one air-blocking baffle that blocks the one or more air passageways between the top of the computer equipment and the inner top of the computer equipment rack along at least a portion of the inner lateral dimension of the computer equipment rack, and semi-permanently mounting the at least one air-blocking baffle that blocks the one or more air passageways between the sides of the computer equipment and the inner sides of the computer equipment rack.

14. The method of claim 1, wherein the at least one air-blocking baffle that blocks the one or more air passageways between the top of the computer equipment and the inner top of the computer equipment rack extends along the entire inner lateral dimension of the computer equipment rack, and wherein the at least one air-blocking baffle that blocks the one or more air passageways between the sides of the computer equipment and the inner sides of the computer equipment rack extends along the entire inner lateral dimension of the computer equipment rack.

15. The method of claim 1, further comprising the steps of:
positioning the at least one air-blocking baffle that blocks the one or more air passageways between the top of the computer equipment and the inner top of the computer equipment rack along at least a portion of the inner lateral dimension of the computer equipment rack proximal to the air inlet duct; and positioning the at least one air-blocking baffle that blocks the one or more air passageways between the sides of the computer equipment and the inner sides of the computer equipment rack along at least a portion of the inner lateral dimension of the computer equipment rack proximal to the air inlet duct.

16. The method of claim 1, wherein at least one of the length of the air inlet duct and the length of the air exhaust duct is less than or equal to about 0.5 times the length of the computer equipment rack.

17. The method of claim 1, further comprising the step of:
semi-permanently attaching the air inlet ducts and air exhaust ducts to the doors of the computer equipment racks with doors thus permitting removal of the air inlet ducts and air exhaust ducts from the doors to allow the doors to be opened without interference from the air inlet ducts and air exhaust ducts.

18. The method of claim 1, further comprising the step of:
to at least one of the computer equipment racks having an air inlet duct mounted thereto, inserting at least one air-blocking baffle along at least a portion of an inner lateral dimension of the computer equipment rack to block one or more air passageways between the computer equipment.

* * * * *